(12) United States Patent
Huang et al.

(10) Patent No.: US 12,276,699 B2
(45) Date of Patent: Apr. 15, 2025

(54) GAS DENSITY RELAY WITH ONLINE SELF-CHECKING FUNCTION AND CHECKING METHOD THEREFOR

(71) Applicant: SHANGHAI ROYE ELECTRIC CO., LTD., Shanghai (CN)

(72) Inventors: Xiaobeng Huang, Shanghai (CN); Haiyong Jin, Shanghai (CN); Haiming Liao, Shanghai (CN); Xiaowei Ye, Shanghai (CN); Yueming Zhu, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 158 days.

(21) Appl. No.: 17/997,547

(22) PCT Filed: Feb. 9, 2021

(86) PCT No.: PCT/CN2021/076138
§ 371 (c)(1),
(2) Date: Oct. 29, 2022

(87) PCT Pub. No.: WO2021/218291
PCT Pub. Date: Nov. 4, 2021

(65) Prior Publication Data
US 2023/0168302 A1 Jun. 1, 2023

(30) Foreign Application Priority Data
Apr. 29, 2020 (CN) .......................... 202010354527.X (51) Int. Cl.
*G01R 31/327* (2006.01)
*G01N 9/26* (2006.01)
(Continued)

(52) U.S. Cl.
CPC .......... *G01R 31/3275* (2013.01); *G01N 9/266* (2013.01); *H01H 35/28* (2013.01); *H01H 35/38* (2013.01)

(58) Field of Classification Search
CPC ............ G01R 31/3275; G01R 31/1254; G01R 31/327; G01N 9/266; G01N 9/00;
(Continued)

(56) References Cited

U.S. PATENT DOCUMENTS

2022/0334183 A1* 10/2022 Jin ...................... G01R 31/3278
2022/0334184 A1* 10/2022 Chang ................ G05B 19/0423
2022/0336170 A1* 10/2022 Xia ........................ H01H 35/32

FOREIGN PATENT DOCUMENTS

| CN | 110501260 A | 11/2019 |
|---|---|---|
| CN | 111446113 A | 7/2020 |

(Continued)

*Primary Examiner* — Giovanni Astacio-Oquendo
(74) *Attorney, Agent, or Firm* — Hsuanyeh Law Group, PC (57) ABSTRACT

The application provides a gas density relay with online self-check function and its check method, including a gas density relay body, a first pressure sensor, a second pressure sensor, a temperature sensor, a gas chamber, a pressure regulating mechanism, an online check contact signal sampling unit and an intelligent control unit. The air path of the pressure regulating mechanism is connected to the gas pressure chamber and the second pressure sensor; Pressure rise and fall can be regulated through the pressure regulating mechanism to make the gas density relay body contact action. The contact action is transmitted to the intelligent control unit through the online check contact signal sampling unit. The intelligent control unit detects the action value and/or return value of the contact signal of the gas density relay body according to the density value when the contact acts, and completes the check work without requiring maintainer to go to the site for check. At the same time, (Continued)

because the pressure regulating mechanism is not connected to the SF6 gas path of the gas density relay body or electrical equipment, its sealing requirements are reduced, the reliability of the power grid is improved, and the manufacturing cost is reduced.

20 Claims, 2 Drawing Sheets

(51) Int. Cl.
 *H01H 35/28* (2006.01)
 *H01H 35/38* (2006.01)

(58) Field of Classification Search
 CPC ...... H01H 35/28; H01H 35/38; H01H 33/563; H01H 35/26; H01H 35/32
 USPC .......................................... 324/415, 418, 417
 See application file for complete search history.

(56) References Cited

FOREIGN PATENT DOCUMENTS

| | | | |
|---|---|---|---|
| JP | 2001243860 A | 9/2001 | |
| JP | 2001337629 A | 12/2001 | |

\* cited by examiner

GAS DENSITY RELAY WITH ONLINE SELF-CHECKING FUNCTION AND CHECKING METHOD THEREFOR

RELATED APPLICATIONS

This is a US national stage application of international application no. PCT/CN2021/076138, filed Feb. 9, 2021, which claims the priority of the Chinese patent application with application number 202010354527. X (Title: a gas density relay with online self-check function and its check method) filed on Apr. 29, 2020.

TECHNICAL FIELD

The invention relates to the field of electric power technology, in particular to a gas density relay with online self-check function and its check method applied to high-voltage and medium-voltage electrical equipment.

BACKGROUND

At present, SF6 (sulfur hexafluoride) electrical equipment has been widely used in the power sector, industrial and mining enterprises, promoting the rapid development of the power industry. In recent years, the capacity of China's power system has expanded rapidly, and the use of SF6 electrical equipment is increasing. The role of SF6 gas in high-voltage electrical equipment is arc extinguishing and insulation. If the density of SF6 gas in high-voltage electrical equipment decreases and the micro water content exceeds the standard, the safe operation of SF6 high-voltage electrical equipment will be seriously affected. Therefore, the power grid operation regulations stipulate that the density and water content of SF6 gas must be regularly tested before and during the operation of the equipment.

With the development of unattended substations towards networking and digitalization, and the increasing requirements for remote control and telemetry, online monitoring of gas density and micro water content of SF6 electrical equipment has important practical significance. With the continuous development of China's intelligent grid, intelligent high-voltage electrical equipment, as an important component and key node of intelligent substation, plays a pivotal role in the security of intelligent grid. At present, most high-voltage electrical equipment are SF6 gas insulated equipment. If the gas density decreases (caused by leakage, etc.), it will seriously affect the electrical performance of the equipment and cause serious hidden dangers for safe operation. At present, online monitoring of the gas density value in SF6 high-voltage electrical equipment has been very common, so the application of gas density monitoring system (gas density relay) will flourish. At the same time, the monitoring system is also equipped with a safe and reliable circuit transmission function, which establishes an effective platform for implementing real-time data remote data reading and information monitoring, and can timely transmit pressure, temperature, density and other information to target equipment (such as computer terminals) for online monitoring.

Regular inspection of gas density relay on electrical equipment is a necessary measure to prevent problems before they occur and ensure safe and reliable operation of electrical equipment. Both the Electric Power Preventive Test Code and the Twenty five Key Requirements for Preventing Major Accidents in Electric Power Production require that the gas density relay be checked regularly. From the actual operation, regular check of gas density relay is one of the necessary means to ensure the safe and reliable operation of power equipment. Therefore, at present, checking gas density relay has been attached great importance and popularized in the power system, and has been implemented by power supply companies, power plants, and large factories and mining enterprises. Power supply companies, power plants and large factories and mining enterprises need to equip testers, equipment vehicles and high-value SF6 gas to complete the on-site check and detection of gas density relays. Including the outage operating loss during detection, roughly calculated, the annual shared detection cost of each high-voltage switch station is about tens of thousands to hundreds of thousands of yuan. In addition, if the on-site check of the inspectors is not standardized, there are potential safety hazards. Therefore, it is very necessary to innovate in the existing gas density self-check gas density relay, especially the gas density online self-check gas density relay or system, so that the gas density relay or the monitoring system composed of the gas density online monitoring also has the check function of the gas density relay, thus completing the regular check of the (mechanical) gas density relay, without requiring maintainer to go to the site for check, improve work efficiency and reduce operation and maintenance costs.

SUMMARY

The invention aims to provide a gas density relay (or gas density monitoring device) with online self-check function and its check method to solve the problems raised in the above technical background.

To achieve the above purpose, the invention adopts the following technical solutions:

The first aspect of the application provides a gas density relay (or gas density monitoring device) with online self-check function, including: a gas density relay body, a pressure chamber, a first pressure sensor, a second pressure sensor, a temperature sensor, a pressure regulating mechanism, an online check contact signal sampling unit and an intelligent control unit;

The gas density relay body comprises a housing, a pressure detection element, a temperature compensation element, a signal generator and a signal regulating mechanism arranged in the housing;

The gas pressure chamber is a sealed cavity enclosed by the shell, or the gas pressure chamber is a sealed cavity arranged outside the shell, and the gas pressure chamber is connected to the internal cavity of the shell;

The first pressure sensor is connected to the pressure detection element of the gas density relay body;

The second pressure sensor is connected to the gas pressure chamber;

The gas path of the pressure regulating mechanism is connected to the gas pressure chamber, so as to connect the gas path of the pressure regulating mechanism with the gas pressure chamber and the second pressure sensor; The pressure regulating mechanism is configured to regulate the pressure rise and fall of the gas pressure chamber, so that the gas density relay body can have contact signal action;

The online check contact signal sampling unit is connected to the gas density relay body and configured to sample the contact signal of the gas density relay body;

The intelligent control unit is respectively connected to the pressure regulating mechanism, the first pressure sensor, the second pressure sensor, the temperature sensor and the online check contact signal sampling unit, and is configured to complete the control of the pressure regulating mechanism, pressure value acquisition, temperature value acquisition, and/or gas density value acquisition, And detecting the contact signal action value and/or the contact signal return value of the gas density relay body;

Wherein, the contact signal includes alarm and/or blocking.

The above gas density relay with online self-check function refers to the integral structure of its components; The gas density monitoring device with the function of online self-check refers to its component design, component structure and flexible composition.

Preferably, the signal generator includes a microswitch or a magnetic assisted electrical contact, and the gas density relay body outputs a contact signal through the signal generator; The pressure detecting element comprises a Baden tube or a corrugated tube; The temperature compensation element adopts a temperature compensation sheet or a gas enclosed in the housing.

Preferably, the first pressure sensor, the online check contact signal sampling unit and the intelligent control unit are arranged on the gas density relay body; Alternatively, the pressure regulating mechanism is arranged on the gas density relay body; Alternatively, the first pressure sensor, the pressure regulating mechanism, the online check contact signal sampling unit and the intelligent control unit are arranged on the gas density relay body; Alternatively, the pressure regulating mechanism and the second pressure sensor are arranged on the gas density relay body; Alternatively, the online check contact signal sampling unit and the intelligent control unit are arranged on the pressure regulating mechanism.

Preferably, the second pressure sensor is arranged on the pressure regulating mechanism; Alternatively, the second pressure sensor is arranged on the gas pressure chamber; Alternatively, the second pressure sensor is arranged in the gas pressure chamber.

Preferably, the gas density relay body and the first pressure sensor are of an integrated structure; Alternatively, the gas density relay body, the first pressure sensor and the temperature sensor are remote gas density relays with an integrated structure.

Preferably, the first pressure sensor and temperature sensor are of an integrated structure. Preferably, the first pressure sensor and temperature sensor are gas density transmitters with integrated structure; Alternatively, the first pressure sensor and temperature sensor constitute a density detection sensor of quartz tuning fork technology.

More preferably, the online check contact signal sampling unit and the intelligent control unit are arranged on the gas density transmitter.

Preferably, the online check contact signal sampling unit and the intelligent control unit are arranged together; Preferably, the online check contact signal sampling unit and the intelligent control unit are sealed in a cavity or shell.

Preferably, the first pressure sensor is installed on the gas path of the gas density relay body; The temperature sensor is installed on the gas path or outside the gas path of the gas density relay body, or in the gas density relay body, or outside the gas density relay body.

Preferably, the intelligent control unit acquires the gas density value collected by the first pressure sensor and temperature sensor; Alternatively, the intelligent control unit acquires the pressure value collected by the first pressure sensor and the temperature value collected by the temperature sensor to complete the online monitoring of the gas density of the monitored electrical equipment by the gas density relay.

Preferably, the intelligent control unit acquires the pressure value P1 and temperature value T collected by the first pressure sensor and the pressure value P2 collected by the second pressure sensor when the contact signal of the gas density relay body acts or switches, and calculates the equivalent gas pressure value P according to the pressure value P1 and the pressure value P2; The online check of the gas density relay is completed according to the equivalent gas pressure value P and the pressure value corresponding to 20° C. converted according to the gas pressure temperature characteristic, i.e. the gas density value $P_{20}$.

The intelligent control unit acquires the pressure value P1 and the temperature value T collected by the first pressure sensor and the pressure value P2 collected by the second pressure sensor when the contact signal of the gas density relay body acts or switches, and calculates the equivalent gas pressure value P according to the pressure value P1, pressure value P2 and atmospheric pressure $P_{atmospheric\ pressure}$; The online check of the gas density relay is completed according to the equivalent gas pressure value P and the pressure value corresponding to 20° C. converted according to the gas pressure temperature characteristic, i.e. the gas density value $P_{20}$.

The intelligent control unit acquires the gas density value $P1_{20}$ collected by the first pressure sensor and temperature sensor and the gas density value $P2_{20}$ collected by the second pressure sensor and temperature sensor when the contact signal of the gas density relay body acts or switches, calculates the gas density value $P_{20}$ according to the gas density value $P1_{20}$ and the gas density value $P2_{20}$ to complete the online check of the gas density relay.

The intelligent control unit acquires the gas density value $P1_{20}$ collected by the first pressure sensor and temperature sensor, the gas density value $P2_{20}$ collected by the second pressure sensor and temperature sensor, and the atmospheric pressure $P_{atmospheric\ pressure}$ when the contact signal of the gas density relay body acts or switches, and calculates the gas density value $P_{20}$ according to the gas density value $P1_{20}$, the gas density value $P2_{20}$, and the atmospheric pressure $P_{atmospheric\ pressure}$ atmospheric pressure to complete the online check of the gas density relay.

More preferably, when the contact signal of the gas density relay body acts or switches, its equivalent gas pressure value P=P1−P2; The online check of the gas density relay is completed according to the equivalent gas pressure value P and the pressure value corresponding to 20° C. converted according to the gas pressure temperature characteristic, i.e. the gas density value $P_{20}$; Alternatively, when the contact signal of the gas density relay body acts or switches, its equivalent gas pressure value P=P1−P2*K, wherein, K is the preset coefficient; The online check of the gas density relay is completed according to the equivalent gas pressure value P, temperature value T, and the pressure value corresponding to 20° C. converted according to the gas pressure temperature characteristics, i.e. the gas density value $P_{20}$.

More preferably, when the contact signal of the gas density relay body acts or switches, the corresponding relationship between the gas density value $P_{20}$ and the gas density values $P1_{20}$, $P2_{20}$ is preset into a data table, and the corresponding gas density value $P_{20}$ is obtained by querying the data table according to the gas density value $P1_{20}$ and the gas density value $P2_{20}$ to complete the online check of the gas density relay.

When the contact signal of the gas density relay body acts or switches, the corresponding relationship between the gas density value $P_{20}$ and the gas density values $P1_{20}$, $P2_{20}$, and $P_{atmospheric\ pressure}$ is preset into a data table, and the corresponding gas density value $P_{20}$ is obtained by querying the data table according to the gas density values $P1_{20}$, $P2_{20}$, and $P_{atmospheric\ pressure}$ to complete the online check of the gas density relay.

When the contact signal of the gas density relay body acts or switches, the corresponding relationship between the gas density value $P_{20}$ and the gas pressure values P1, P2, and the temperature value T is preset into a data table, and the corresponding gas density value $P_{20}$ is obtained by querying the data table according to the gas pressure values P1, P2, and the temperature value T to complete the online check of the gas density relay.

When the contact signal of the gas density relay body acts or switches, the corresponding relationship between the gas density value $P_{20}$ and the gas pressure values P1, P2, $P_{atmospheric\ pressure}$ and temperature value T is preset into a data table, and the corresponding gas density value $P_{20}$ is obtained by querying the data table according to the gas pressure values P1, P2, $P_{atmospheric\ pressure}$ and temperature value T to complete the online check of the gas density relay.

Preferably, the first pressure sensor and the second pressure sensor are absolute pressure sensors; Alternatively, the first pressure sensor and the second pressure sensor are relative pressure sensors; Alternatively, when the first pressure sensor and the second pressure sensor are not the same type of sensor, atmospheric pressure correction is performed.

Preferably, the gas density relay body is provided with a comparison density value output signal, which is connected to the intelligent control unit; Alternatively, the gas density relay body is provided with a comparison pressure value output signal, which is connected to the intelligent control unit.

Preferably, the gas density relay (or gas density monitoring device) also comprises a valve, one end of the valve is provided with a connection port connected to the atmosphere, and the other end of the valve is connected to the pressure regulating mechanism or the gas pressure chamber; Preferably, the valve is also connected to the intelligent control unit, and is closed or opened under the control of the intelligent control unit.

More preferably, the valve is an electric valve, and/or a solenoid valve, or a piezoelectric valve, or a temperature controlled valve, or a new valve made of intelligent memory materials and opened or closed by electric heating.

Preferably, the pressure regulating mechanism is sealed in a cavity or shell.

Preferably, during check, the pressure regulating mechanism is a closed gas chamber, and the outside or inside of the closed gas chamber is equipped with heating elements and/or refrigeration elements. Heating through the heating elements and/or refrigeration through the refrigeration elements will cause the temperature change of the gas in the closed gas chamber, thus completing the pressure rise and fall of the gas density relay.

The pressure regulating mechanism is a cavity with an opening at one end, and the other end of the cavity is connected to the gas pressure chamber; The cavity is provided with a piston, one end of the piston is connected to an adjusting rod, the outer end of the adjusting rod is connected to a driving component, the other end of the piston extends into the opening, and is sealed with the inner wall of the cavity. The driving component drives the adjusting rod to drive the piston to move in the cavity.

The pressure regulating mechanism is a closed gas chamber, the inside of the closed gas chamber is provided with a piston, the piston is in sealed contact with the inner wall of the closed gas chamber, the outside of the closed gas chamber is provided with a driving component, and the driving component drives the piston to move in the chamber through electromagnetic force.

The pressure regulating mechanism is a gasbag connected to a driving component at one end, the gasbag changes in volume under the driving of the driving component, and the gasbag is connected to the gas pressure chamber.

The pressure regulating mechanism is a corrugated pipe, one end of the corrugated pipe is connected to the gas pressure chamber, and the other end of the corrugated pipe is retracted under the drive of the driving component.

The pressure regulating mechanism is an air release valve, and the air release valve is a solenoid valve or an electric valve, or an air release valve implemented by electric or pneumatic means.

The pressure regulating mechanism is a compressor.

The pressure regulating mechanism is a pump, which comprises a pressure making pump, a booster pump, an electric air pump and an electromagnetic air pump.

The pressure regulating mechanism is a booster valve;

Wherein, the driving components include magnetic driving mechanism, motor, reciprocating mechanism, Carnot circulation mechanism, magnetic coupling thrust mechanism, heating thrust generation mechanism, electric heating thrust generation mechanism, chemical reaction thrust generation mechanism and one of pneumatic components.

More preferably, the pressure regulating mechanism also comprises an insulating element which is arranged outside the closed gas chamber.

Preferably, the online check contact signal sampling unit includes an isolation sampling element which is controlled by a gas density relay body, a pressure regulating mechanism, or an intelligent control unit; In the non-check state, the online check contact signal sampling unit is relatively isolated from the contact signal of the gas density relay body on the circuit by isolating the sampling element; In the check state, the online check contact signal sampling unit cuts off the contact signal control circuit of the gas density relay body through the isolation sampling element, and connects the contact of the gas density relay body with the intelligent control unit; Wherein, the isolation sampling element includes one of the travel switch, microswitch, button, electric switch, displacement switch, electromagnetic relay, optocoupler and thyristor.

Preferably, the online check contact signal sampling unit samples the contact signal of the gas density relay body to meet the following requirements: the online check contact signal sampling unit has at least two independent groups of sampling contacts, which can automatically check at least two contacts at the same time, and continuously measure without changing contacts or reselecting contacts; The contacts include, but are not limited to, alarm contact, alarm contact+blocking contact, alarm contact+blocking 1 contact+blocking 2 contact, alarm contact+blocking contact+overvoltage contact.

Preferably, the test voltage of the online check contact signal sampling unit to the contact signal action value or its switching value of the gas density relay body is not less than 24V, that is, during check, a voltage of not less than 24V is applied between the corresponding terminals of the contact signal.

Preferably, the gas density relay (or gas density monitoring device) also includes: a temperature regulating mechanism, which is a temperature adjustable regulating mechanism and is configured to regulate the temperature rise and fall of the temperature compensation element of the gas density relay body, and then cooperates or/and combines with the pressure regulating mechanism to make the gas density relay body produce contact signal action; The intelligent control unit is connected to the temperature regulating mechanism to complete the control of the temperature regulating mechanism.

More preferably, the temperature regulating mechanism is a heating element; Alternatively, the temperature regulating mechanism comprises a heating element, an insulating element, a temperature controller, a temperature detector and a temperature regulating mechanism shell; Alternatively, the temperature regulating mechanism comprises a heating element and a temperature controller; Alternatively, the temperature regulating mechanism comprises a heating element, a heating power regulator and a temperature controller; Alternatively, the temperature regulating mechanism comprises a heating element, a refrigeration element, a heating power regulator and a temperature controller; Alternatively, the temperature regulating mechanism comprises a heating element, a heating power regulator and a thermostatic controller; Alternatively, the temperature regulating mechanism comprises a heating element, a temperature controller and a temperature detector; Alternatively, the temperature regulating mechanism is a heating element which is arranged near the temperature compensation element; Alternatively, the temperature regulating mechanism is a miniature thermostatic box; Wherein, the number of the heating element is at least one, and the heating element includes one of silicon rubber heater, resistance wire, heating band, electric heating rod, hot air blower, infrared heating device and semiconductor; The temperature controller is connected to the heating element to control the heating temperature of the heating element. The temperature controller includes a PID controller, a controller combining PID and fuzzy control, a frequency conversion controller and a PLC controller.

Preferably, at least two gas density relay bodies, at least two first pressure sensors, at least two second pressure sensors, at least two gas pressure chambers, at least two pressure regulating mechanisms, at least two online check contact signal sampling units, an intelligent control unit and a temperature sensor are connected to complete the online check of the gas density relay.

At least two gas density relay bodies, at least two first pressure sensors, at least two second pressure sensors, at least two gas pressure chambers, at least two online check contact signal sampling units and an intelligent control unit, a temperature sensor, and a pressure regulator are connected to complete the online check of the gas density relay.

At least two gas density relay bodies, at least two first pressure sensors, at least two gas pressure chambers, at least two online check contact signal sampling units and an intelligent control unit, a temperature sensor, a pressure regulating mechanism, and a second pressure sensor are connected to complete the online check of the gas density relay.

Preferably, the gas density relay (or gas density monitoring device) also comprises a multichannel joint, wherein the gas density relay body and the first pressure sensor are arranged on the multichannel joint; Alternatively, the pressure regulating mechanism is arranged on the multichannel joint; Alternatively, the gas density relay body, the first pressure sensor and the pressure regulating mechanism are arranged on the multichannel joint; Alternatively, the online check contact signal sampling unit, intelligent control unit and temperature sensor are arranged on the multichannel joint.

Preferably, the gas density relay (or gas density monitoring device) also includes a micro water sensor connected to the gas density relay body and the intelligent control unit respectively, and/or a decomposition sensor connected to the gas density relay body and the intelligent control unit respectively.

Preferably, the gas density relay body includes, but is not limited to, a bimetallic sheet compensated gas density relay, a gas compensated gas density relay, a bimetallic sheet and a gas compensated hybrid gas density relay; Fully mechanical gas density relay, digital gas density relay, mechanical and digital combined gas density relay; Gas density relay with pointer display, digital display type gas density relay, and gas density switch without display or indication; SF6 gas density relay, SF6 mixed gas density relay, N2 gas density relay.

Preferably, the online check contact signal sampling unit is connected to the signal generator.

Preferably, the gas density relay body also includes a display mechanism, which includes a movement, a pointer, and a dial, and the movement is fixed on the base or in the housing; The other end of the temperature compensation element is also connected to the movement through a connecting rod or directly connected to the movement; The pointer is installed on the movement and in front of the dial. The pointer displays the gas density value in combination with the dial; and/or the display mechanism includes a digital device or a liquid crystal device having an indication display.

Preferably, the first pressure sensor or the second pressure sensor can be an absolute pressure sensor, a relative pressure sensor, or an absolute pressure sensor and a relative pressure sensor; It can be a diffused silicon pressure sensor, a MEMS pressure sensor, a chip type pressure sensor, a coil induced pressure sensor (such as a pressure sensor with an induction coil attached to a Baden tube), or a resistance pressure sensor (such as a pressure sensor with a sliding wire resistance attached to a Baden tube); It can be an analog pressure sensor or a digital pressure sensor.

Preferably, the temperature sensor can be a thermocouple, a thermistor, or a semiconductor type; It can be contact type or non-contact type; It can be thermal resistance and thermocouple.

Preferably, the electrical equipment includes SF6 gas electrical equipment, SF6 mixed gas electrical equipment, environment-friendly gas electrical equipment, or other insulating gas electrical equipment. Specifically, the electrical equipment includes GIS, GIL, PASS, circuit breaker, current transformer, voltage transformer, transformer, inflatable cabinet and ring main unit.

Preferably, the intelligent control unit is based on the embedded system embedded algorithm and control program of the microprocessor to automatically control the entire check process, including all peripherals, logic and input/output.

More preferably, the intelligent control unit automatically controls the entire check process, including all peripherals, logic, input and output, based on embedded algorithms and control programs such as general-purpose computers, industrial personal computers, ARM chips, AI chips, CPU, MCU, FPGA, PLC, etc., industrial control motherboards, embedded mainboards, etc.

Preferably, the intelligent control unit has an electrical interface, which completes test data storage, and/or test data export, and/or test data printing, and/or data communication can be conducted with the upper computer; and/or analog quantity and digital quantity information can be entered.

Preferably, the gas density relay (or gas density monitoring device) supports basic information input, and the basic information includes one or more of factory number, accuracy requirements, rated parameters, manufacturer and operating position.

Preferably, the intelligent control unit also includes a communication module for long-distance transmission of test data and/or check results.

More preferably, the communication mode of the communication module is wired communication or wireless communication.

Furthermore, the wired communication mode includes one or more of RS232 bus, RS485 bus, CAN-BUS bus, 4-20 mA, Hart, IIC, SPI, Wire, coaxial cable, PLC power carrier and cable.

Further, the wireless communication mode includes one or more of NB-IoT, 2G/3G/4G/5G, WIFI, Bluetooth, Lora, Lorawan, Zigbee, infrared, ultrasonic, acoustic, satellite, optical, quantum communication and sonar.

Preferably, the intelligent control unit is also provided with a clock, which is configured to periodically set the check time of the gas density relay, or record the test time, or record the event time.

Preferably, the control of the intelligent control unit is controlled through on-site control and/or background control.

More preferably, the gas density relay (or gas density monitoring device) completes online check of the gas density relay according to the settings or instructions of the background; Alternatively, according to the set check time of the gas density relay, the online check of the gas density relay is completed.

Preferably, the gas density relay (or gas density monitoring device) also includes a display interface for human-computer interaction, which is connected to the intelligent control unit to display current check data in real time and/or support data input.

Preferably, the gas density relay (or gas density monitoring device) also includes a camera for monitoring.

Preferably, at least one of the temperature sensors is arranged near, on, or integrated with the temperature compensation element of the gas density relay body. Preferably, at least one temperature sensor is arranged at one end of the pressure detection element of the gas density relay body close to the temperature compensation element.

Preferably, the gas density relay body (or gas density monitoring device) also includes a contact resistance detection unit; The contact resistance detection unit is connected to the contact signal or directly connected to the signal generator; Under the control of the online check contact signal sampling unit, the contact signal of the gas density relay body is isolated from its control circuit. When the contact signal acts, and/or when receiving the command to detect the contact resistance of the contact, the contact resistance detection unit can detect the contact resistance value of the gas density relay body.

Preferably, the gas density relay body (or gas density monitoring device) also includes an insulation resistance detection unit; The insulation resistance detection unit is connected to the contact signal or directly connected to the signal generator; Under the control of the online check contact signal sampling unit, the contact signal of the gas density relay body is isolated from its control circuit. When the contact signal acts, and/or when receiving the command to detect the contact insulation resistance, the insulation resistance detection unit can detect the contact insulation resistance value of the gas density relay body.

The second aspect of the application provides a check method for a gas density relay, which includes: under normal working conditions, the gas density relay monitors the gas density value in electrical equipment;

The gas density relay is allowed to check the gas density relay body according to the set check time or/and check command and the gas density value:

The pressure regulating mechanism is driven by the intelligent control unit to make the gas pressure in the gas pressure chamber rise slowly, so that the gas density relay body has contact action. The contact action is transmitted to the intelligent control unit through the online check contact signal sampling unit. The intelligent control unit calculates or queries the corresponding data sheet according to the pressure value P1 of the first pressure sensor, the pressure value P2 and the temperature value T of the second pressure sensor when the contact acts, gets the gas density value, detects the contact signal action value of the gas density relay body, and completes checking the contact signal action value of the gas density relay body;

When all contact signals are checked, the intelligent control unit restores the pressure regulating mechanism to restore the pressure of the gas pressure chamber to atmospheric pressure or the corresponding specified pressure.

Preferably, the check method for a gas density relay includes: in normal working state, the gas density relay monitors the gas density value in the electrical equipment, and the gas density relay monitors the gas density value in the electrical equipment online through the first pressure sensor, temperature sensor and intelligent control unit;

The gas density relay is allowed to check the gas density relay body according to the set check time or/and check command and the gas density value:

The online check contact signal sampling unit is adjusted to the check state through the intelligent control unit. In the check state, the online check contact signal sampling unit cuts off the control circuit of the contact signal of the gas density relay body, and connects the contact of the gas density relay body to the intelligent control unit;

The pressure regulating mechanism is driven by the intelligent control unit to make the gas pressure in the gas pressure chamber rise slowly, so that the gas density relay body has contact action. The contact action is transmitted to the intelligent control unit through the online check contact signal sampling unit. The intelligent control unit calculates or queries the corresponding data sheet according to the pressure value P1 of the first pressure sensor, the pressure value P2 and the temperature value T of the second pressure sensor when the contact acts, gets the gas density value, detects the contact signal action value of the gas density relay body, and completes checking the contact signal action value of the gas density relay body;

The intelligent control unit drives the pressure regulating mechanism to make the gas pressure drop slowly, so that the gas density relay body has contact reset. The contact reset is transmitted to the intelligent control unit through the online check contact signal sampling unit. The intelligent control unit obtains the gas density value through calculation or query of the corresponding data table according to the pressure value P1 of the first pressure sensor, the pressure value P2 and the temperature value T of the second pressure sensor when the contact resets, Detect the contact signal return value of the gas density relay body, and complete checking the contact signal return value of the gas density relay body;

When all the contact signal check is completed, the intelligent control unit restores the pressure regulating mechanism to restore the pressure of the gas pressure chamber to atmospheric pressure or the corresponding specified pressure, and adjusts the online check contact signal sampling unit to the working state. The control circuit of the contact signal of the gas density relay body returns to the normal working state.

Preferably, the gas density relay also comprises a temperature regulating mechanism; The check method for the gas density relay includes: in the normal working state, the gas density relay monitors the gas density value in the electrical equipment, and the gas density relay monitors the gas density value in the electrical equipment online through the first pressure sensor, temperature sensor and intelligent control unit;

The gas density relay is allowed to check the gas density relay body according to the set check time or/and check command and the gas density value:

The online check contact signal sampling unit is adjusted to the check state through the intelligent control unit. In the check state, the online check contact signal sampling unit cuts off the control circuit of the contact signal of the gas density relay body, and connects the contact of the gas density relay body to the intelligent control unit;

The pressure regulating mechanism is driven by the intelligent control unit to make the gas pressure in the gas pressure chamber rise slowly, and the temperature regulating mechanism is controlled by the intelligent control unit to make the temperature of the temperature compensation element of the gas density relay body rise, so that the gas density relay body has contact action, and the contact action is transmitted to the intelligent control unit through the online check contact signal sampling unit, According to the pressure value P1 of the first pressure sensor, the pressure value P2 of the second pressure sensor and the temperature value T when the contact acts, the intelligent control unit obtains the gas density value by calculating or querying the corresponding data table, detects the contact signal action value of the gas density relay body to complete checking the contact signal action value of the gas density relay body;

The intelligent control unit drives the pressure regulating mechanism to make the gas pressure drop slowly, and the intelligent control unit controls the temperature regulating mechanism to make the temperature of the temperature compensation element of the gas density relay body drop, so that the gas density relay body has a contact reset, which is transmitted to the intelligent control unit through the online check contact signal sampling unit, According to the pressure value P1 of the first pressure sensor, the pressure value P2 of the second pressure sensor and the temperature value T when the contact is reset, the intelligent control unit obtains the gas density value by calculating or querying the corresponding data table, detects the contact signal return value of the gas density relay body to complete checking the contact signal return value of the gas density relay body;

When all the contact signal check work is completed, the intelligent control unit restores the pressure regulating mechanism to restore the pressure of the gas pressure chamber to atmospheric pressure or the corresponding specified pressure, and the intelligent control unit turns off the heating element of the temperature regulating mechanism, and adjusts the online check contact signal sampling unit to the working state, and the control circuit of the contact signal of the gas density relay body returns to the normal working state.

Preferably, the check method for a gas density relay includes: in normal working state, the gas density relay monitors the gas density value in electrical equipment;

The gas density relay is allowed to check the gas density relay body according to the set check time or/and check command and the gas density value:

The pressure regulating mechanism is driven by the intelligent control unit to make the gas pressure in the gas pressure chamber rise slowly, making the gas density relay body contact action. The contact action is transmitted to the intelligent control unit through the online check contact signal sampling unit. The intelligent control unit calculates or queries the corresponding data sheet according to the pressure value P1 of the first pressure sensor, the pressure value P2 of the second pressure sensor, the temperature value T, and the $P_{atmospheric\ pressure}$ when the contact action occurs, Get the gas density value, detect the contact signal action value of the gas density relay body to complete checking the contact signal action value of the gas density relay body;

When all contact signals are checked, the intelligent control unit restores the pressure regulating mechanism to restore the pressure of the gas pressure chamber to atmospheric pressure or the corresponding specified pressure.

Preferably, when the contact signal of the gas density relay body acts or switches, its equivalent gas pressure value $P=P1-P2$; The online check of the gas density relay is completed according to the equivalent gas pressure value P and the pressure value corresponding to 20° C. converted according to the gas pressure temperature characteristic, i.e. the gas density value $P_{20}$; Alternatively, when the contact signal of the gas density relay body acts or switches, its equivalent gas pressure value $P=P1-P2*K$, wherein, K is the preset coefficient; The online check of the gas density relay is completed according to the equivalent gas pressure value P, temperature value T, and the pressure value corresponding to 20° C. converted according to the gas pressure temperature characteristics, i.e. the gas density value $P_{20}$.

Preferably, the first pressure sensor and the second pressure sensor are absolute pressure sensors; Alternatively, the first pressure sensor and the second pressure sensor are relative pressure sensors; Alternatively, when the first pressure sensor and the second pressure sensor are not the same type of sensor, atmospheric pressure correction is performed.

Preferably, the contact signal includes alarm, and/or lockout.

Preferably, the first pressure sensor and temperature sensor are of an integrated structure. Preferably, the first pressure sensor and temperature sensor are gas density transmitters with integrated structure; Alternatively, the first pressure sensor and temperature sensor constitute a density detection sensor of quartz tuning fork technology.

Preferably, after the gas density relay completes the check, if there is any abnormality, it can automatically send an alarm and upload it to the remote end or the designated receiver.

Preferably, the check method also includes: on-site display of gas density value and check result, or background display of gas density value and check result.

Preferably, the check method also includes: the control of the intelligent control unit is controlled on site and/or through the background.

Compared with the prior art, the technical solution of the invention has the following beneficial effects:

The application provides a gas density relay with online self-check function and its check method, which are used for high-voltage and medium-voltage electrical equipment, including a gas density relay body, a first pressure sensor, a second pressure sensor, a temperature sensor, a pressure chamber, a pressure regulating mechanism, an online check contact signal sampling unit and an intelligent control unit. The signal generator or/and the signal regulating mechanism are arranged in the gas pressure chamber. The gas path of the pressure regulating mechanism is connected to the gas pressure chamber, so as to connect the gas path of the pressure regulating mechanism with the gas pressure chamber and the second pressure sensor. The pressure regulating mechanism regulates the rise and fall of the gas pressure in the gas chamber, so that the gas density relay body contacts, The contact action is transmitted to the intelligent control unit through the online check contact signal sampling unit. The intelligent control unit detects the alarm and/or blocking contact signal action value and/or return value of the gas density relay body according to the density value when the contact acts. Checking the gas density relay can be completed without the maintainer coming to the site, which improves the reliability of the power grid, improves the efficiency, and reduces the cost. The maintenance free gas density relay can be implemented, and the zero discharge of SF6 gas is implemented during the whole check process, meeting the requirements of environmental protection regulations. The application has made technical innovation: the pressure regulating mechanism is not connected to the SF6 main gas path of the gas density relay or electrical equipment, which can improve the reliability of the power grid, reduce its sealing requirements, reduce the manufacturing cost, and improve the convenience and flexibility of on-site installation. The application implements online check of gas density relay, thus implementing intelligent management of the whole life cycle of gas density relay: only repair if there is a problem, and no operation and maintenance service if there is no problem.

BRIEF DESCRIPTION OF DRAWINGS

The drawings constituting a part of the application are used to provide a further understanding of the application. The schematic embodiments and their descriptions of the application are used to explain the application, and do not constitute an improper limitation of the application. In the drawings.

DETAILED DESCRIPTION

In order to make the purpose, technical solution and effect of the invention more clear and definite, the invention is further described in detail below with reference to the drawings and examples. It should be understood that specific embodiments are only used to explain the invention, not to define the invention.

Embodiment 1

Figure 1:
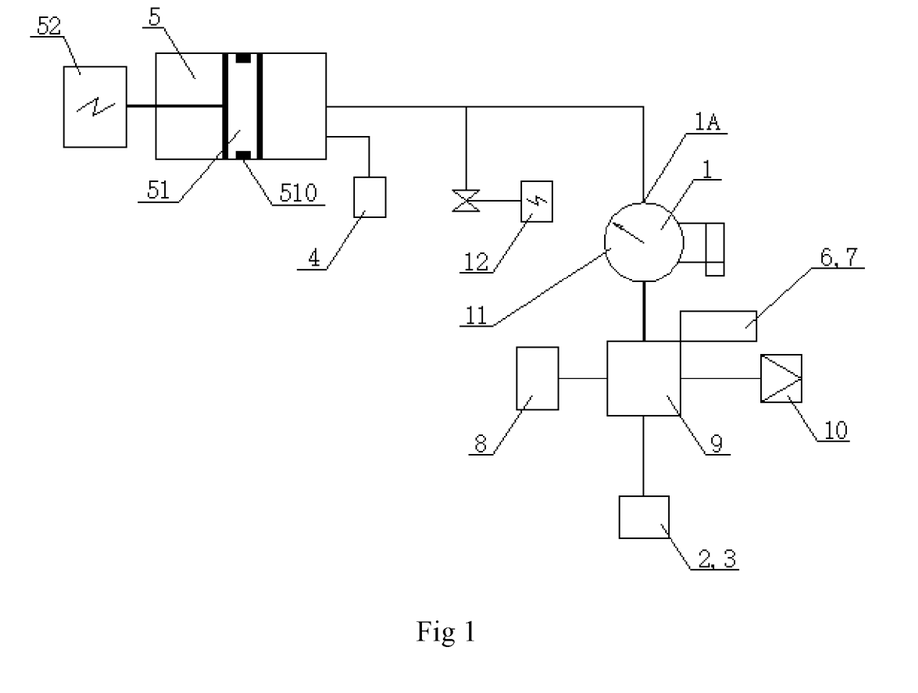
FIG. 1 is the structural diagram of the gas density relay with online self-check function in Embodiment 1.

As shown in FIG. 1, a gas density relay (or gas density monitoring device) with online self-check function provided by Embodiment 1 of the invention includes: gas density relay body 1, first pressure sensor 2, second pressure sensor 4, temperature sensor 3, gas pressure chamber 11, pressure regulating mechanism 5, online check contact signal sampling unit 6, intelligent control unit 7, valve 12, multichannel joint 9 and air supply interface 10. Wherein, the gas pressure chamber 11 is a sealed chamber enclosed by the housing of the gas density relay body 1, and the gas pressure in the housing is atmospheric pressure or the corresponding specified atmospheric pressure (such as standard atmospheric pressure); The multichannel joint 9 is connected to the electrical equipment 8; The gas density relay body 1, the first pressure sensor 2, the temperature sensor 3 and the air supplement interface 10 are arranged on the multichannel joint 9.

Specifically, the gas density relay body 1 mainly comprises a housing, a pressure detection element, a temperature compensation element, a signal generator and a signal regulating mechanism; The pressure detection element, temperature compensation element, signal generator and signal regulating mechanism are all arranged inside the housing, that is, the pressure detection element, temperature compensation element, signal generator and signal regulating mechanism are all arranged inside the gas pressure chamber 11. The first pressure sensor 2 is connected to the pressure detection element of the gas density relay body 1 (Baden tube is used in this embodiment, with SF6 gas inside) in the gas path through the multichannel joint 9. In the air path, the pressure regulating mechanism 5 is connected to the gas pressure chamber 11 through the air hole 1A on the gas pressure chamber 11, and the valve 12 is arranged in the air path connected to the gas pressure chamber 11 and the pressure regulating mechanism 5; The second pressure sensor 4 is arranged on the pressure regulating mechanism 5, that is, the second pressure sensor 4 and the valve 12 are connected to the gas pressure chamber 11 and the pressure regulating mechanism 5. The valve 12 in this embodiment is an electric control valve. The pressure regulating mechanism 5 in this embodiment is a cavity with an opening at one end. There is a piston 51 in the cavity. The piston 51 is provided with a sealing ring 510. One end of the piston 51 is connected to an adjusting rod. The outer end of the adjusting rod is connected to a driving component 52. The other end of the piston 51 extends into the opening and contacts the inner wall of the cavity, The driving component 52 drives the adjusting rod to drive the piston 51 to move in the cavity. The drive component 52 includes, but is not limited to, a magnetic drive mechanism, a motor (variable frequency motor or stepping motor), a reciprocating motion mechanism, a Carnot cycle mechanism, and a pneumatic element. The online check contact signal sampling unit 6 is respectively connected to the gas density relay body 1 and the intelligent control unit 7; The valve 12, the first pressure sensor 2, the temperature sensor 3, the second pressure sensor 4 and the pressure regulating mechanism 5 are respectively connected to the intelligent control unit 7; The air supplement interface 10 is connected to the multichannel joint 9. Pressure regulating mechanism 5 can be flexibly arranged on electrical equipment 8, multichannel joint 9, or gas density relay body 1.

The gas density relay body 1 can be a bimetallic sheet compensated gas density relay, a gas compensated gas density relay, or a bimetallic sheet and gas compensated gas density relay; Fully mechanical gas density relay, digital gas density relay, mechanical and digital combined gas density relay; Density relay with indication (density relay with pointer display, density relay with digital display, density relay with LCD display), density relay without indication (density switch); SF6 gas density relay, SF6 mixed gas density relay, N2 gas density relay, other gas density relays, etc.

The first pressure sensor 2 or the second pressure sensor 4 can be absolute pressure sensor, relative pressure sensor, or absolute pressure sensor and relative pressure sensor, and the number can be several. The pressure sensor can be in the form of diffusion silicon pressure sensor, MEMS pressure sensor, chip pressure sensor, coil induced pressure sensor (such as the pressure measurement sensor with induction coil attached to the Baden tube), resistance pressure sensor (such as the pressure measurement sensor with sliding wire resistance attached to the Baden tube), analog pressure sensor or digital pressure sensor. Pressure acquisition includes pressure sensors, pressure transmitters and other pressure sensing elements, such as diffused silicon type, sapphire type, piezoelectric type, and strain gauge type (resistance strain gauge type, ceramic strain gauge type).

The temperature sensor 3 can be: thermocouple, thermistor, semiconductor type; It can be contact type or non-contact type; It can be thermal resistance and thermocouple. In a word, temperature sensors, temperature transmitters and other temperature sensing elements can be used for temperature acquisition.

The control of valve 12 can adopt various transmission modes, such as manual, electric, hydraulic, pneumatic, turbine, electromagnetic, electromagnetic hydraulic, electro-hydraulic, pneumatic, spur gear, bevel gear drive, etc; Under the action of pressure, temperature or other forms of sensing signals, it can act according to the predetermined requirements, or it can simply open or close without relying on the sensing signals. The valve can lift, slide, swing or rotate the opening and closing parts depending on the drive or automatic mechanism, so as to change the size of its flow channel area to achieve its control function. The valve 12 can be an automatic valve, a power driven valve and a manual valve according to the driving mode. The automatic valve can include: electromagnetic drive, electromagnetic hydraulic drive, electric hydraulic drive, turbine drive, spur gear drive, bevel gear drive, pneumatic drive, hydraulic drive, gas hydraulic drive, electric drive, motor (motor) drive. The valve can be automatic, manual or semi-automatic. The check process can be automatic or semi-automatic through manual cooperation. The valve is directly or indirectly connected, integrated or separated with electrical equipment through self sealing valve, manual valve or non dismantling valve. The valve can be normally-open, normally-closed, one-way or two-way as required. In a word, the air circuit can be opened or closed through the electric control valve. The electric control valve can be: solenoid valve, electric control ball valve, electric valve, electric control proportional valve, etc.

The online check contact signal sampling unit 6 mainly completes the contact signal sampling of the gas density relay body 1. That is, the basic requirements or functions of online check contact signal sampling unit 6 are as follows: 1) The safe operation of electrical equipment will not be affected during check. That is, when the contact signal of gas density relay body 1 acts during check, the safe operation of electrical equipment will not be affected; 2) The contact signal control circuit of the gas density relay body 1 will not affect the performance of the gas density relay, especially the performance of the intelligent control unit 7, and will not damage the gas density relay or affect the test work.

The basic requirement or function of the intelligent control unit 7 is to complete the control of the valve 12, the control of the pressure regulating mechanism 5 and the signal acquisition through the intelligent control unit 7, so that the pressure value and temperature value when the contact signal of the gas density relay body 1 acts can be detected, and converted into the corresponding pressure value $P_{20}$ (density value) at 20° C., that is, the contact action value $P_{D20}$ of the gas density relay body 1 can be detected, Complete checking gas density relay body 1; Alternatively, it can directly detect the density value $P_{D20}$ when the contact signal of gas density relay body 1 acts, and complete checking gas density relay body 1.

Of course, the intelligent control unit 7 can also implement: test data storage; and/or test data export; and/or test data can be printed; and/or data communication can be conducted with the upper computer; and/or analog quantity and digital quantity information can be entered. The intelligent control unit 7 also includes a communication module, through which test data and/or check results can be transmitted remotely; When the rated pressure value of the gas density relay body 1 outputs a signal, the intelligent control unit 7 simultaneously collects the current density value to complete checking the rated pressure value of the gas density relay body 1. At the same time, the self-check among the gas density relay body 1, the first pressure sensor 2 and the temperature sensor 3 can be completed through the test of the rated pressure value of the gas density relay body 1 to achieve maintenance free.

Electrical equipment 8, including SF6 gas electrical equipment, SF6 mixed gas electrical equipment, environment-friendly gas electrical equipment, or other insulated gas electrical equipment. Specifically, electrical equipment includes GIS, GIL, PASS, circuit breaker, current transformer, voltage transformer, transformer, gas filled cabinet and ring main unit.

Gas density relay body 1, first pressure sensor 2, temperature sensor 3, second pressure sensor 4, valve 12, pressure regulating mechanism 5, online check contact signal sampling unit 6, intelligent control unit 7 and multichannel joint 9 can be flexibly set as required. For example, the gas density relay body 1, the first pressure sensor 2 and the temperature sensor 3 are arranged together; Or the valve 12 and the pressure regulating mechanism 5 are arranged together. In a word, the settings between them can be flexibly arranged and combined according to specific requirements.

Working principle: the intelligent control unit 7 monitors the gas pressure and temperature of electrical equipment 8 according to the first pressure sensor 2 and temperature sensor 3, and obtains the corresponding 20° C. pressure value $P_{20}$ (i.e. gas density value). When the density relay body 1 needs to be checked, if the gas density value $P_{20} \geq$ the set safety check density value $P_S$; The gas density relay (or gas density monitoring device) sends a command, and the intelligent control unit 7 disconnects the control circuit of the gas density relay body 1, so that the online check of the gas density relay body 1 will not affect the safe operation of electrical equipment 8, nor will it send a false alarm signal or lock the control circuit during the check. Because the gas density relay has been monitored and judged that the gas density value $P_{20} \geq$ the set safety check density value $P_S$ before starting check, the gas of electrical equipment 8 is within the safe operation range, and gas leakage is a slow process, which is safe during check. At the same time, the intelligent control unit 7 connects the contact sampling circuit of the gas density relay body 1, and then drives the pressure regulating mechanism 5 through the intelligent control unit 7 to make the gas pressure in the gas pressure chamber 11 rise slowly, so that the gas density relay body 1 takes contact action. The contact action is transmitted to the intelligent control unit 7 through the online check contact signal sampling unit 6. The intelligent control unit 7 is based on the pressure value P1 The pressure value P2 and temperature value T of the second pressure sensor 4 are calculated or queried in the corresponding data table to obtain the gas density value $P_{20}$. The contact signal action value $P_{D20}$ of the gas density relay body 1 is detected, and checking the contact signal action value $P_{D20}$ of the gas density relay body 1 is completed. Specifically, when the contact signal of gas density relay body 1 acts or switches, its equivalent gas pressure value P=P1−P2; The online check of the gas density relay is completed according to the equivalent gas pressure value P and the pressure value corresponding to 20° C. converted according to the gas pressure temperature characteristics, i.e. the gas density value $P_{20}$. Alternatively, when the contact signal of the gas density relay body 1 acts or switches, the corresponding relationship between the gas density value $P_{20}$ and the gas density values $P1_{20}$, $P2_{20}$ is designed into a data table, and the gas density value $P_{20}$ is obtained by querying the data table according to the gas density value $P1_{20}$ and the gas density value $P2_{20}$, thus completing the online check of the gas density relay; Alternatively, when the contact signal of the gas density relay body 1 acts or switches, the corresponding relationship between the gas density value P20 and the gas pressure values P1, P2, and the temperature value T is designed into a data table, and the gas density value $P_{20}$ is obtained by querying the data table according to the gas pressure values P1, P2, and the temperature value T to complete the online check of the gas density relay.

Then, the pressure regulating mechanism 5 is driven through the intelligent control unit 7 to slowly reduce the gas pressure of the gas pressure chamber 11, so that the contact reset of the gas density relay body 1 occurs. The contact reset is transmitted to the intelligent control unit 7 through the online check contact signal sampling unit 6. The intelligent control unit 7 is based on the pressure value P1 of the first pressure sensor 2, the pressure value P2 and the temperature value T of the second pressure sensor 4 when the contact is reset, After calculation or query of the corresponding data table, the gas density value $P_{20}$ is obtained, the contact signal return value $P_{F20}$ of the gas density relay body 1 is detected, and checking the contact signal return value $P_{F20}$ of the gas density relay body 1 is completed; When all the contact signal check work is completed, the intelligent control unit 7 restores the pressure regulating mechanism 5 to restore the pressure of the gas pressure chamber 11 to atmospheric pressure or the corresponding specified pressure, and adjusts the online check contact signal sampling unit 6 to the working state. The control circuit of the contact signal of the gas density relay body 1 returns to the normal working state.

The intelligent control unit 7 controls the driving part 52 of the pressure regulating mechanism 5 (which can be mainly implemented by motors (motors) and gears in various and flexible ways), and then regulates the piston 51 of the pressure regulating mechanism 5, so that the volume of the sealing chamber composed of the piston 51, the gas pressure chamber 11, and the valve 12 changes, and the pressure of the gas in the gas pressure chamber 11 increases gradually, thus making the gas density relay body 1 contact, The contact action is uploaded to the intelligent control unit 7 through the online check contact signal sampling unit 6. The intelligent control unit 7 can detect the contact action value $P_{D20}$ of the gas density relay body 1 by converting the pressure value P1, P2 and temperature value measured during the contact action into the corresponding pressure value $P_{20}$ (density value) at 20° C. according to the gas characteristics, After all the contact action values of the alarm and/or blocking signals of the gas density relay body 1 are detected, the intelligent control unit 7 controls the motor (motor, or variable frequency motor) of the pressure regulating mechanism 5, regulates the piston 51 of the pressure regulating mechanism 5, so that the pressure of the gas in the gas pressure chamber 11 decreases gradually, and tests the return value of the alarm and/or blocking contact signals of the gas density relay body 1. For example, take the checked parameters of SF6 gas density relay: rated pressure 0.6 MPa, alarm pressure 0.55 MPa, blocking pressure 0.50 MPa as an example. Assuming that the checked temperature T=5° C., assuming that when the checked alarm contact signal acts, the pressure value P1=0.5609 MPa and temperature value T=5° C. collected by the first pressure sensor 2 and temperature sensor 3, and the pressure value P2=0.042 MPa collected by the second pressure sensor 4, its equivalent gas pressure value P=P1−P2=0.5609−0.042=0.5189 MPa; According to the equivalent gas pressure value P=0.5189 MPa and the pressure value corresponding to 20° C. converted according to the SF6 gas pressure temperature characteristics, that is, the action value PBJD20 of the alarm contact is 0.5597 MPa, with an error of 0.5597−0.55=0.0097 MPa, so that the online check of the alarm contact of the gas density relay can be easily completed; Suppose that the pressure value P1=0.5609 MPa and temperature value T=5° C. collected by the first pressure sensor 2 and temperature sensor 3, and the pressure value P2=0.086 MPa collected by the second pressure sensor 4 when checking the action of the blocking contact signal, the equivalent gas pressure value P=P1−P2=0.5609−0.086=0.4749 MPa; According to the equivalent gas pressure value P=0.4749 MPa, and according to the gas pressure temperature characteristics, it is converted to the corresponding pressure value of 20° C., that is, the action value $P_{BSD20}$ of the alarm contact is 0.5122 MPa (abs.), with an error of 0.5122−0.50=−0.0122 MPa, so that the online check of the blocking contact of the gas density relay can be easily completed. Repeat the check for many times (for example, 2-3 times), and then calculate the average value, thus completing checking gas density relay body 1. Then, the intelligent control unit 7 disconnects the contact sampling circuit of the gas density relay body 1. At this time, the contact of the gas density relay body 1 is not connected to the intelligent control unit 7. At the same time, the intelligent control unit 7 restores the pressure regulating mechanism 5 to restore the pressure of the gas pressure chamber 11 to atmospheric pressure or the corresponding specified pressure. The control circuit of the gas density relay body 1 is connected through the intelligent control unit 7, the density monitoring circuit of the gas density relay body 1 works normally, and the gas density of the electrical equipment 8 is monitored safely by the gas density relay body 1, so that the electrical equipment 8 can work safely and reliably. In this way, online check of gas density relay body 1 can be easily completed, and the safe operation of electrical equipment 8 will not be affected during online check.

When the gas density relay body 1 has completed the check, the gas density relay will make a decision, and the notice about detection result can be released. The mode is flexible, specifically: 1) The gas density relay can be displayed locally, such as through indicator light, digital or LCD; 2) Or the gas density relay can be uploaded via online remote communication, for example, it can be uploaded to the background of the online monitoring system; 3) Or upload to specific terminals through wireless upload, for example, wireless upload to mobile phones; 4) Or upload through other channels; 5) Or upload the abnormal results through the alarm signal line or special signal line; 6) Uploading alone or bundled with other signals. In a word, after completing the online check of gas density relay body 1, the gas density relay can automatically send an alarm in case of any abnormality, which can be uploaded to the remote end or sent to a designated receiver, such as a mobile phone. Alternatively, after the gas density relay completes checking the gas density relay body 1, if there is any abnormality, the intelligent control unit 7 can upload the alarm contact signal of the gas density relay body 1 to the remote end (monitoring room, background monitoring platform, etc.), and can also display the notice locally. The simple online check of gas density relay can upload the abnormal results through the alarm signal line. It can be uploaded according to certain rules. For example, in case of abnormality, a contact is connected in parallel at the alarm signal contact, which is closed and disconnected regularly, and the condition can be obtained through analysis; Or upload through an independent check signal line. It can be uploaded in good condition or in case of problems. It can also be uploaded through remote density online monitoring, or the check results can be uploaded through a separate check signal line, or through local display, local alarm, or through wireless upload, online upload with intelligent phones. Its communication mode is wired or wireless. The wired communication mode can be RS232, RS485, CAN-BUS and other industrial buses, optical Ethernet, 4-20 mA, Hart, IIC, SPI, wire, coaxial cable or PLC power carrier; Wireless communication mode can be 2G/3G/4G/5G, WIFI, Bluetooth, Lora, Lorawan, Zigbee, infrared, ultrasonic, acoustic, satellite, optical, quantum communication, sonar or sensor with built-in 5G/NB-IoT communication module (such as NB-IoT). In a word, the reliable performance of gas density relay can be fully guaranteed by multiple ways and combinations.

The gas density relay has the safety protection function. Specifically, when it is lower than the set value, the gas density relay will automatically stop online check of the gas density relay body and send a notice signal. For example, when the gas density value of the equipment is less than the set value $P_S$, the check will not be carried out. Only when the gas density value of the equipment is ≥(alarm pressure value+0.02 MPa), the online check can be carried out.

The gas density relay can be checked online according to the set time or the set temperature (such as extreme high temperature, high temperature, extreme low temperature, low temperature, normal temperature, 20° C., etc.). During online check of high temperature, low temperature, normal temperature and 20° C. ambient temperature, the error judgment requirements are different. For example, during check of 20° C. ambient temperature, the accuracy requirements of the gas density relay can be level 1.0 or 1.6, and it can be level 2.5 at high temperature. The details can be implemented according to the requirements of temperature and relevant standards. For example, according to 4.8 temperature compensation performance provisions in DL/T 259 check Code for Sulfur Hexafluoride Gas Density Relays, the accuracy requirements corresponding to each temperature value.

The gas density relay can compare its error performance in different temperature and time periods. That is, the performance of gas density relay and electrical equipment can be judged by comparison in different periods and within the same temperature range. There is a comparison between different periods of history and between history and the present.

The gas density relay body 1 can be repeatedly checked for many times (such as 2-3 times), and the average value is calculated according to the results of each check. If necessary, the gas density relay body 1 can be checked online at any time.

The gas density relay has the functions of pressure and temperature measurement and software conversion. On the premise of not affecting the safe operation of electrical equipment 8, the alarm and/or blocking contact action value and/or return value of gas density relay body 1 can be detected online. Of course, the return value of alarm and/or blocking contact signal can also be not tested as required. At the same time, the gas density relay can also monitor the gas density value, and/or pressure value, and/or temperature value of electrical equipment 8 online, and upload them to the target equipment for online monitoring.

Embodiment 2

Figure 2:
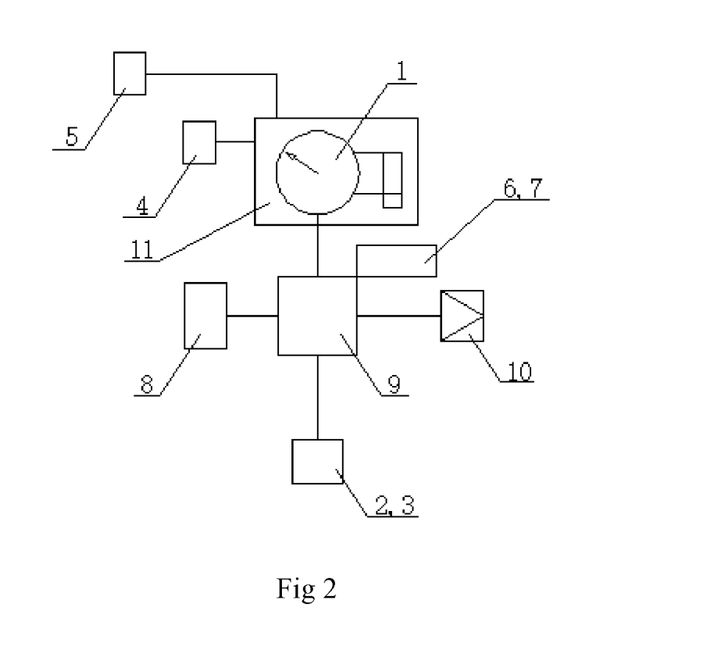
FIG. 2 is the structural diagram of the gas density relay with online self-check function in Embodiment 2.

As shown in FIG. 2, the gas density relay (or gas density monitoring device) with online self-check function provided by the second embodiment of the invention includes: gas density relay body 1, first pressure sensor 2, second pressure sensor 4, temperature sensor 3, gas pressure chamber 11, pressure regulating mechanism 5, online check contact signal sampling unit 6, intelligent control unit 7, multichannel joint 9, and air supply interface 10. Wherein, gas pressure chamber 11 is arranged outside the housing of gas density relay body 1 and connected to the internal cavity of the housing of gas density relay body 1; Multichannel joint 9 is connected to electrical equipment 8; Gas density relay body 1, first pressure sensor 2, temperature sensor 3 and air supplement interface 10 are arranged on multichannel joint 9.

Specifically, the gas density relay body 1 mainly comprises a housing, a pressure detection element, a temperature compensation element, a signal generator and a signal regulating mechanism; The pressure detection element, temperature compensation element, signal generator and signal regulating mechanism are all arranged inside the housing, that is, the pressure detection element, temperature compensation element, signal generator and signal regulating mechanism are all arranged inside the gas pressure chamber 11. The first pressure sensor 2 is connected to the pressure detection element (Baden tube is used in this embodiment) of the gas density relay body 1 in the gas path through the multichannel joint 9. In the air path, the pressure regulating mechanism 5 is connected to the gas pressure chamber 11; The second pressure sensor 4 is arranged on the gas pressure chamber 11, that is, the second pressure sensor 4 is connected to the gas pressure chamber 11 and the pressure regulating mechanism 5.

It is obviously different from Embodiment 1 that the gas pressure chamber 11 in this embodiment is arranged outside the housing of the gas density relay body 1. The gas pressure of the gas pressure chamber 11 is adjusted through the pressure regulating mechanism 5, and then the gas pressure of the internal chamber of the housing is adjusted, so that the gas density relay body 1 can take contact action. The contact action is transmitted to the intelligent control unit 7 through the online check contact signal sampling unit 6. The intelligent control unit 7 is based on the pressure value P1 of the first pressure sensor 2 when the gas density relay body 1 takes contact action The pressure value P2 and temperature value T of the second pressure sensor 4 are converted into the corresponding density value P20, and the alarm and/or blocking contact action value PD20 and/or return value PF20 of the gas density relay body 1 are detected to complete checking the gas density relay body 1.

Embodiment 3

Figure 3:
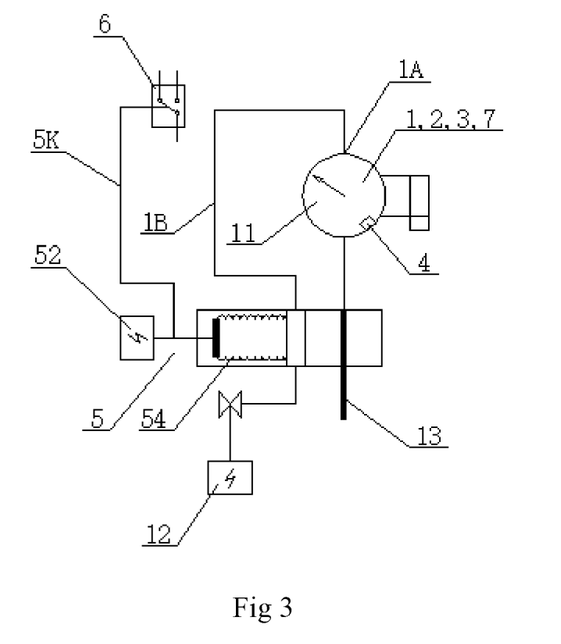
FIG. 3 is the structural diagram of the gas density relay with online self-check function in Embodiment 3.
Figure 4:
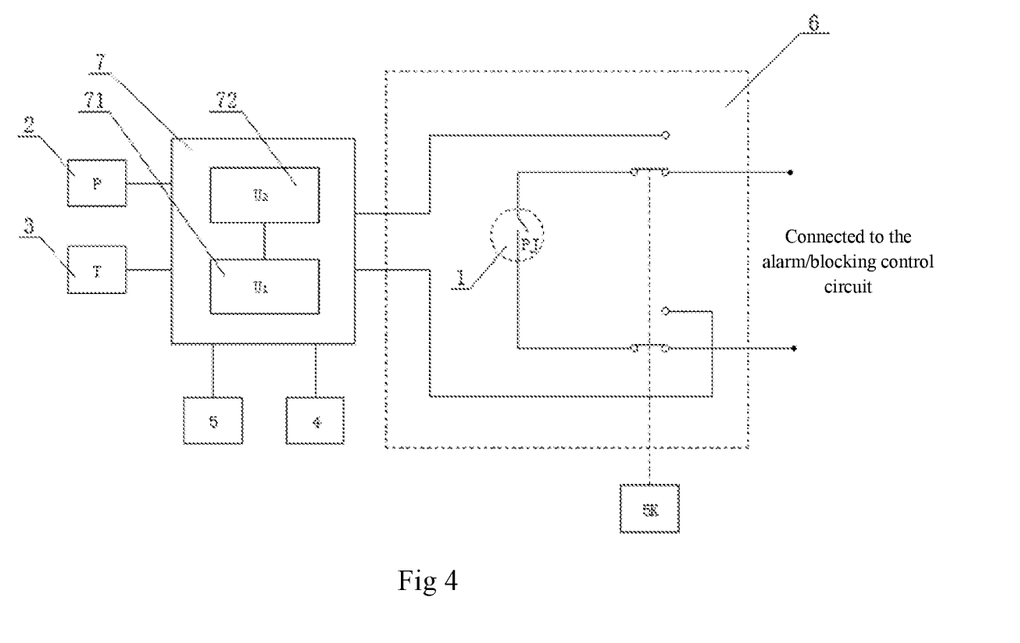
FIG. 4 is the circuit diagram of the gas density relay with online self-check function in Embodiment 3.

As shown in FIGS. 3 and 4, the third embodiment of the invention provides a gas density relay (or gas density monitoring device) with online self-check function, including: gas density relay body 1, first pressure sensor 2, second pressure sensor 4, temperature sensor 3, gas pressure chamber 11, pressure regulating mechanism 5, online check contact signal sampling unit 6, intelligent control unit 7, valve 12 and joint 13. Wherein, the gas density relay body 1 is provided with joint 13 for fixed connection with the pressure regulating mechanism 5; The gas pressure chamber 11 is a sealed chamber enclosed by the housing of the gas density relay body 1, and the gas pressure in the housing is atmospheric pressure or the corresponding specified atmospheric pressure; The pressure sensor 2, temperature sensor 3, online check contact signal sampling unit 6 and intelligent control unit 7 are arranged on the gas density relay body 1.

Specifically, the gas density relay body 1 mainly comprises a housing, a pressure detection element, a temperature compensation element, a signal generator and a signal regulating mechanism; The pressure detection element, temperature compensation element, signal generator and signal regulating mechanism are all arranged inside the housing, that is, the pressure detection element, temperature compensation element, signal generator and signal regulating mechanism are all arranged inside the gas pressure chamber 11. The first pressure sensor 2 is connected to the pressure detection element of the gas density relay body 1 (in this embodiment, the Baden tube is used, with SF6 gas inside) in the gas path. In the embodiment, the valve 12 is an electric control valve, and the valve 12 is arranged on the pressure regulating mechanism 5; In the air path, the pressure regulating mechanism 5 is connected to the gas pressure chamber 11 through the air hole 1A of the gas pressure chamber 11; The second pressure sensor 4 is arranged in the gas pressure chamber 11, that is, in the air path, the second pressure sensor 4 and the valve 12 are connected to the gas pressure chamber 11 and the pressure regulating mechanism 5.

The difference from Embodiment 1 is that:
1) The pressure regulating mechanism 5 of the embodiment is mainly composed of a bellows 54 and a driving component 52. Bellows 54 and gas pressure chamber 11 are hermetically connected to form a reliable sealing chamber. According to the control of the intelligent control unit 7, the pressure regulating mechanism 5 makes the driving part 52 push the bellows 54 to change the volume and the sealing chamber to change the volume, thus completing the rise and fall of the gas pressure of the gas pressure chamber 11.

2) The driving part 52 is also provided with a contact signal interlocking part 5K, through which the online check contact signal sampling unit 6 can be controlled. As shown in FIG. 4, the online check contact signal sampling unit 6 is controlled by the contact signal interlocking part 5K, mainly completing the contact signal sampling of the gas density relay body 1. That is, the basic requirements or functions of online check contact signal sampling unit 6 are: a) The safe operation of electrical equipment will not be affected during check. That is, when the contact signal of gas density relay body 1 acts during check, the safe operation of electrical equipment will not be affected; b) The contact signal control circuit of the gas density relay body 1 will not affect the performance of the gas density relay, especially the performance of the intelligent control unit 7, and will not damage the gas density relay or affect the test work. During check, the contact signal interlock 5K can cut off the contact signal control circuit of the gas density relay body 1 to ensure that the contact action signal of the gas density relay body 1 will not be uploaded during check, thus not affecting the safe operation of the power grid.

The pressure regulating mechanism 5 regulates the gas pressure rise and fall of the gas pressure chamber 11 to make the gas density relay body 1 contact action. The contact action is transmitted to the intelligent control unit 7 (mainly composed of the processor 71 (U1) and the power supply 72 (U2)) through the online check contact signal sampling unit 6. The intelligent control unit 7 is based on the density value, pressure value and temperature value when the contact of the gas density relay body 1 acts, The alarm and/or blocking contact action value and/or return value of gas density relay body 1 are detected to complete checking gas density relay body 1. Alternatively, only the alarm and/or blocking contact action value of gas density relay body 1 can be detected to complete checking gas density relay body 1.

In this embodiment, the first pressure sensor 2 can be two, namely, the first pressure sensor and the second pressure sensor; The temperature sensor 3 can be two, namely the first temperature sensor and the second temperature sensor. This embodiment has the safety protection function, specifically: 1) When the density value monitored by the first pressure sensor and the first temperature sensor, or the second pressure sensor and the second temperature sensor is lower than the set value, the gas density relay will automatically stop checking the gas density relay body 1 and send a notice signal. For example, when the gas density value of the equipment is less than the set value, the check will not be carried out. Only when the gas density value of the equipment is ≥(blocking pressure+0.02 MPa), the check can be carried out. The set value can be set as required. 2) At the same time, the gas density relay also has the mutual check of multiple pressure sensors and temperature sensors, as well as the mutual check of sensors and gas density relay to ensure that the gas density relay works normally. Namely, the pressure values monitored by the first pressure sensor and the second pressure sensor shall be compared and mutually checked; The temperature values monitored by the first temperature sensor and the second temperature sensor are compared and mutually checked; The density value $P11_{20}$ monitored by the first pressure sensor and the first temperature sensor is compared with the density value $P12_{20}$ monitored by the second pressure sensor and the second temperature sensor for mutual check; It is even possible to compare $P11_{20}$ and $P12_{20}$ with the density value $Pe_{20}$ of the rated value of the gas density relay body 1 respectively for mutual check.

In this application, when the gas density relay body 1 is an absolute pressure type gas density relay, the first pressure sensor 2 and the second pressure sensor 4 are both absolute pressure type sensors; When the gas density relay body 1 is a relative pressure type gas density relay, the first pressure sensor 2 and the second pressure sensor 4 are both relative pressure type sensors; In addition, if the first pressure sensor 2 and the second pressure sensor 4 are not of the same type, atmospheric pressure correction is required. In a word, accurate calculation can be carried out according to the characteristics of gas density relay body 1 (absolute pressure type or relative pressure type) and in combination with the sensors used, which conforms to the characteristics of gas density relay body 1.

For the gas density relay with online self-check function, when the contact of the gas density relay body is checked at high temperature, low temperature, normal temperature and 20° C. ambient temperature, the requirements for error determination may be different. The specific requirements can be implemented according to the temperature requirements and relevant standards; The error performance of the gas density relay can be compared according to different temperatures and time periods. That is to say, the performance of density relay can be judged by comparison in different periods and within the same temperature range. There is a comparison between different periods of history and between history and the present. The body of the gas density relay can also be examined. If necessary, the contact signal of gas density relay can be checked at any time; Determine whether the density value of the gas density relay body and the monitored electrical equipment is normal. That is, it can judge, analyze and compare the normal and abnormal density value of electrical equipment, gas density relay body, pressure sensor and temperature sensor, so as to judge, compare and analyze the gas density monitoring of electrical equipment, gas density relay body and other states; It also monitors the contact signal status of the gas density relay and transmits its status remotely. The contact signal status of the gas density relay can be known in the background: open or closed, so as to provide more monitoring and improve reliability; It can detect, detect and judge the temperature compensation performance of the gas density relay body; It can detect, detect and judge the contact resistance of the gas density relay body; It can also detect, detect and judge the insulation performance of the gas density relay body.

To sum up, a gas density relay with online self-check function and its check method provided in the application are composed of a gas path (through a pipeline) connection part, a pressure regulation part, a signal measurement control part, etc. Its main function is to perform online check and measurement of the contact value (pressure value when alarm/lockout action occurs) of the gas density relay body at ambient temperature, It is automatically converted to the corresponding pressure value at 20° C., and the performance test of the contact (alarm and lockout) value of the gas density relay is implemented online. The installation positions of the gas density relay body, the first pressure sensor, the second pressure sensor, the temperature sensor, the gas pressure chamber, the pressure regulating mechanism, the valve, the online check contact signal sampling unit and the intelligent control unit can be flexibly combined. For example, the gas density relay body, the first pressure sensor, the temperature sensor, the online check contact signal sampling unit, and the intelligent control unit can be combined and designed in an integrated way or separately; It can be installed on the shell, or on the multichannel joint, or connected together by connecting pipes. The first pressure sensor, temperature sensor, online check contact signal sampling unit and intelligent control unit can be combined for integrated design; The first pressure sensor and temperature sensor can be combined and designed in an integrated way; On line check contact signal sampling unit and intelligent control unit can be combined together for integrated design. In a word, the structure is different.

The application has made technical innovation: the pressure regulating mechanism is not connected to the SF6 main gas path of the gas density relay body or electrical equipment, thus greatly improving the reliability of the power grid, reducing its sealing requirements, and greatly reducing the manufacturing cost, improving the convenience and flexibility of on-site installation.

It should be noted that a gas density relay with online self-check function generally means that its components are designed into an integrated structure; The gas density monitoring device generally refers to its component design, component structure and flexible composition. The gas density relay can use the original gas density relay of the substation for technical transformation and upgrading.

The above specific embodiments of the invention have been described in detail, but they are only Embodiment s, and the invention is not limited to the above specific embodiments. For those skilled in the art, any equivalent modification and substitution of the invention are also included in the scope of the invention. Therefore, the equal transformation and modification made without departing from the spirit and scope of the invention should be included in the scope of the invention.

The invention claimed is:

1. A gas density relay with online self-check function, characterized in that it includes:
    a gas density relay body, a gas pressure chamber, a first pressure sensor, a second pressure sensor, a temperature sensor, a pressure regulating mechanism, an online check contact signal sampling unit and an intelligent control unit;
    the gas density relay body comprises a housing, a pressure detection element, a temperature compensation element, a signal generator and a signal regulating mechanism arranged in the housing;
    the gas pressure chamber is a sealed cavity enclosed by the shell, or the gas pressure chamber is a sealed cavity arranged outside the shell, and the gas pressure chamber is connected to the internal cavity of the shell;
    the first pressure sensor is connected to the pressure detection element of the gas density relay body;
    the second pressure sensor is connected to the gas pressure chamber;
    the gas path of the pressure regulating mechanism is connected to the gas pressure chamber, so as to connect the gas path of the pressure regulating mechanism with the gas pressure chamber and the second pressure sensor;
    the pressure regulating mechanism is configured to regulate the pressure rise and fall of the gas pressure chamber, so that the gas density relay body can have contact signal action;
    the online check contact signal sampling unit is connected to the gas density relay body and configured to sample the contact signal of the gas density relay body;

the intelligent control unit is respectively connected to the pressure regulating mechanism, the first pressure sensor, the second pressure sensor, the temperature sensor and the online check contact signal sampling unit, and is configured to complete at least one of: the control of the pressure regulating mechanism, pressure value acquisition, temperature value acquisition, or gas density value acquisition, and detecting the contact signal action value or the contact signal return value of the gas density relay body;

wherein, the contact signal includes at least one of: alarm or blocking.

2. The gas density relay with online self-check function as claimed in claim 1, characterized in that the signal generator includes a microswitch or a magnetic assisted electrical contact, and the gas density relay body outputs a contact signal through the signal generator; the pressure detecting element comprises a Baden tube or a corrugated tube; the temperature compensation element adopts a temperature compensation sheet or a gas enclosed in the housing.

3. The gas density relay with online self-check function as claimed in claim 1, characterized in that at least one of: the first pressure sensor, the online check contact signal sampling unit and the intelligent control unit are arranged on the gas density relay body; the pressure regulating mechanism is arranged on the gas density relay body; the first pressure sensor, the pressure regulating mechanism, the online check contact signal sampling unit and the intelligent control unit are arranged on the gas density relay body; the pressure regulating mechanism and the second pressure sensor are arranged on the gas density relay body; The online check contact signal sampling unit and the intelligent control unit are arranged on the pressure regulating mechanism.

4. The gas density relay with online self-check function as claimed in claim 1, characterized in that the first pressure sensor is installed on the gas path of the gas density relay body; the second pressure sensor is arranged on the pressure regulating mechanism, or the second pressure sensor is arranged on the gas pressure chamber, or the second pressure sensor is arranged in the gas pressure chamber; the temperature sensor is installed on the gas path or outside the gas path of the gas density relay body, or in the gas density relay body, or outside the gas density relay body.

5. The gas density relay with online self-check function as claimed in claim 1, characterized in that at least one of: the intelligent control unit acquires the gas density value collected by the first pressure sensor and temperature sensor; the intelligent control unit acquires the pressure value collected by the first pressure sensor and the temperature value collected by the temperature sensor to complete the online monitoring of the gas density of the monitored electrical equipment by the gas density relay.

6. The gas density relay with online self-check function as claimed in claim 1, characterized in that when the intelligent control unit acquires the contact signal action or switching of the gas density relay body, the pressure value P1 collected by the first pressure sensor, the temperature value T collected by the temperature sensor, and the pressure value P2 collected by the second pressure sensor, the equivalent gas pressure P is calculated according to the pressure P1 and P2; the online check of the gas density relay is completed according to the equivalent gas pressure value P and the pressure value corresponding to 20° C. converted according to the gas pressure temperature characteristic, the gas density value $P_{20}$; the intelligent control unit acquires the pressure value P1 and the temperature value T collected by the first pressure sensor and the pressure value P2 collected by the second pressure sensor when the contact signal of the gas density relay body acts or switches, and calculates the equivalent gas pressure value P according to the pressure value P1, pressure value P2 and atmospheric pressure $P_{atmospheric\ pressure}$; the online check of the gas density relay is completed according to the equivalent gas pressure value P and the pressure value corresponding to 20° C. converted according to the gas pressure temperature characteristic, the gas density value P20; the intelligent control unit acquires the gas density value $P1_{20}$ collected by the first pressure sensor and temperature sensor and the gas density value $P2_{20}$ collected by the second pressure sensor and temperature sensor when the contact signal of the gas density relay body acts or switches, calculates the gas density value P20 according to the gas density value $P1_{20}$ and the gas density value $P2_{20}$ to complete the online check of the gas density relay; the intelligent control unit acquires the gas density value $P1_{20}$ collected by the first pressure sensor and temperature sensor, the gas density value $P2_{20}$ collected by the second pressure sensor and temperature sensor, and the atmospheric pressure P atmos$_p$heric$_p$ressure when the contact signal of the gas density relay body acts or switches, and calculates the gas density value $P_{20}$ according to the gas density value $P1_{20}$, the gas density value $P2_{20}$, and the atmospheric pressure $P_{atmospheric\ pressure}$ to complete the online check of the gas density relay.

7. The gas density relay with online self-check function as claimed in claim 6, characterized in that when the contact signal of the gas density relay body acts or switches, its equivalent gas pressure value P=P1−P2; the online check of the gas density relay is completed according to the equivalent gas pressure value P and the pressure value corresponding to 20° C. converted according to the gas pressure temperature characteristic, the gas density value $P_20$; when the contact signal of the gas density relay body acts or switches, its equivalent gas pressure value P=P1−P2*K, wherein, K is the preset coefficient; the online check of the gas density relay is completed according to the equivalent gas pressure value P, temperature value T, and the pressure value corresponding to 20° C. converted according to the gas pressure temperature characteristics, the gas density value $P_{20}$.

8. The gas density relay with online self-check function as claimed in claim 6, characterized in that at least one of: when the contact signal of the gas density relay body acts or switches, the corresponding relationship between the gas density value P20 and the gas density values $P1_{20}$, $P2_{20}$ is preset into a data table, and the corresponding gas density value $P_{20}$ is obtained by querying the data table according to the gas density value $P1_{20}$ and the gas density value $P2_{20}$, completing the online check of the gas density relay; when the contact signal of the gas density relay body acts or switches, the corresponding relationship between the gas density value $P_{20}$ and the gas density values $P1_{20}$, $P2_{20}$, and P atmospheric pressure is preset into a data table, and the corresponding gas density value $P_{20}$ is obtained by querying the data table according to the gas density values $P1_{20}$, $P2_{20}$, and P atmospheric pressure to complete the online check of the gas density relay; when the contact signal of the gas density relay body acts or switches, the corresponding relationship between the gas density value $P_{20}$ and the gas pressure values P1, P2, and the temperature value T is preset into a data table, and the corresponding gas density value $P_{20}$ is obtained by querying the data table according to the gas pressure values P1, P2, and the temperature value T to complete the online check of the gas density relay; when the contact signal of the gas density relay body acts or switches, the corresponding relationship between the gas density value $P_{20}$ and the gas pressure values P1, P2, P atmospheric pressure and temperature value T is preset into a data table, and the corresponding gas density value $P_{20}$ is obtained by querying the data table according to the gas pressure values P1, P2, P atmospheric pressure and temperature value T to complete the online check of the gas density relay.

9. The gas density relay with online self-check function as claimed in claim 1, characterized in that at least one of: the first pressure sensor and the second pressure sensor are absolute pressure sensors; the first pressure sensor and the second pressure sensor are relative pressure sensors; when the first pressure sensor and the second pressure sensor are not the same type of sensor, atmospheric pressure correction is performed.

10. The gas density relay with online self-check function as claimed in claim 1, characterized in that: the gas density relay also includes a valve, one end of the valve is provided with a connection port connected to the atmosphere, and the other end of the valve is connected to the pressure regulating mechanism or the gas pressure chamber; wherein, the valve is at least one of: an electric valve, or a solenoid valve, or a piezoelectric valve, or a temperature controlled valve, or a new valve made of intelligent memory materials and opened or closed by electric heating.

11. The gas density relay with online self-check function as claimed in claim 1, characterized in that the pressure regulating mechanism is sealed in a cavity or shell.

12. The gas density relay with online self-check function as claimed in claim 1, characterized in that at least one of:
during check, the pressure regulating mechanism is a closed gas chamber, and the outside or inside of the closed gas chamber is provided with heating elements or refrigeration elements, which are heated by the heating elements or cooled by the refrigeration elements, resulting in the temperature change of the gas in the closed gas chamber, and further completing the pressure rise and fall of the gas density relay;
the pressure regulating mechanism is a cavity with an opening at one end, and the other end of the cavity is connected to the gas pressure chamber; the cavity is provided with a piston, one end of the piston is connected to an adjusting rod, the outer end of the adjusting rod is connected to a driving component, the other end of the piston extends into the opening, and is sealed with the inner wall of the cavity, the driving component drives the adjusting rod to drive the piston to move in the cavity;
the pressure regulating mechanism is a closed gas chamber, the inside of the closed gas chamber is provided with a piston, the piston is in sealed contact with the inner wall of the closed gas chamber, the outside of the closed gas chamber is provided with a driving component, and the driving component drives the piston to move in the chamber through electromagnetic force;
the pressure regulating mechanism is a gasbag connected to a driving component at one end, the gasbag changes in volume under the driving of the driving component, and the gasbag is connected to the gas pressure chamber;
the pressure regulating mechanism is a corrugated pipe, one end of the corrugated pipe is connected to the gas pressure chamber, and the other end of the corrugated pipe is retracted under the drive of the driving component; the pressure regulating mechanism is a vent valve, and the vent valve includes a solenoid valve or an electric valve;
the pressure regulating mechanism is a compressor;
the pressure regulating mechanism is a pump, which comprises a pressure making pump, a booster pump, an electric air pump and an electromagnetic air pump;
the pressure regulating mechanism is a booster valve;
wherein, the driving components include magnetic driving mechanism, motor, reciprocating mechanism, Carnot circulation mechanism, magnetic coupling thrust mechanism, heating thrust generation mechanism, electric heating thrust generation mechanism, chemical reaction thrust generation mechanism and one of pneumatic components.

13. The gas density relay with online self-check function as claimed in claim 1, characterized in that the online check contact signal sampling unit includes an isolation sampling element, which is controlled by the gas density relay body, or a pressure regulating mechanism, or an intelligent control unit; in the non-check state, the online check contact signal sampling unit is relatively isolated from the contact signal of the gas density relay body on the circuit by isolating the sampling element; in the check state, the online check contact signal sampling unit cuts off the contact signal control circuit of the gas density relay body through the isolation sampling element, and connects the contact of the gas density relay body with the intelligent control unit; wherein, the isolation sampling element includes one of the travel switch, microswitch, button, electric switch, displacement switch, electromagnetic relay, optocoupler and thyristor.

14. The gas density relay with online self-check function as claimed in claim 1, characterized in that: the gas density relay also includes a temperature regulating mechanism, the temperature regulating mechanism is a temperature adjustable regulating mechanism, which is configured to at least one of: regulate the temperature rise and fall of the temperature compensation element of the gas density relay body, and then cooperate or combine with the pressure regulating mechanism, enabling the gas density relay body to generate contact signal action; the intelligent control unit is connected to the temperature regulating mechanism to complete the control of the temperature regulating mechanism.

15. The gas density relay with online self-check function as claimed in claim 14, characterized in that at least one of:
the temperature regulating mechanism is a heating element;
the temperature regulating mechanism comprises a heating element, an insulating element, a temperature controller, a temperature detector and a temperature regulating mechanism shell;
the temperature regulating mechanism comprises a heating element and a temperature controller; the temperature regulating mechanism comprises a heating element, a heating power regulator and a temperature controller;
the temperature regulating mechanism comprises a heating element, a refrigeration element, a heating power regulator and a temperature controller;
the temperature regulating mechanism comprises a heating element, a heating power regulator and a thermostatic controller; the temperature regulating mechanism comprises a heating element, a temperature controller and a temperature detector;
the temperature regulating mechanism is a heating element which is arranged near the temperature compensation element;

the temperature regulating mechanism is a miniature thermostatic box;

wherein, the number of the heating element is at least one, and the heating element includes one of silicon rubber heater, resistance wire, heating band, electric heating rod, hot air blower, infrared heating device and semiconductor;

the temperature controller is connected to the heating element to control the heating temperature of the heating element, the temperature controller includes a PID controller, a controller combining PID and fuzzy control, a frequency conversion controller and a PLC controller.

16. The gas density relay with online self-check function as claimed in claim 1, characterized in that at least one of: the gas density relay also includes a multichannel joint, the gas density relay body and the first pressure sensor are arranged on the multichannel joint;

the pressure regulating mechanism is arranged on the multichannel joint;

the gas density relay body, the first pressure sensor and the pressure regulating mechanism are arranged on the multichannel joint;

the online check contact signal sampling unit, intelligent control unit and temperature sensor are arranged on the multichannel joint.

17. A check method for gas density relay with online self-check function as claimed in claim 1, characterized in that: in normal working state, the gas density relay monitors the gas density value in electrical equipment; the gas density relay is allowed to check the gas density relay body according to at least one of: the set check time or check command and the gas density value;

the pressure regulating mechanism is driven by the intelligent control unit to make the gas pressure in the gas pressure chamber rise slowly, so that the gas density relay body has contact action;

the contact action is transmitted to the intelligent control unit through the online check contact signal sampling unit;

the intelligent control unit calculates or queries the corresponding data sheet according to the pressure value P1 of the first pressure sensor, the pressure value P2 and the temperature value T of the second pressure sensor when the contact acts, gets the gas density value, detects the contact signal action value of the gas density relay body, and completes checking the contact signal action value of the gas density relay body;

when all contact signals are checked, the intelligent control unit restores the pressure regulating mechanism to restore the pressure of the gas pressure chamber to atmospheric pressure or the corresponding specified pressure.

18. The check method for gas density relay with online self-check function as claimed in claim 17, characterized in that: in normal working state, the gas density relay monitors the gas density value in the electrical equipment, while the gas density relay monitors the gas density value in the electrical equipment online through the first pressure sensor, temperature sensor and intelligent control unit; The gas density relay is allowed to check the gas density relay body according to the set check time or/and check command and the gas density value;

the online check contact signal sampling unit is adjusted to the check state through the intelligent control unit, in the check state, the online check contact signal sampling unit cuts off the control circuit of the contact signal of the gas density relay, and connects the contact of the gas density relay body to the intelligent control unit;

the pressure regulating mechanism is driven by the intelligent control unit to make the gas pressure in the gas pressure chamber rise slowly, so that the gas density relay body has contact action, the contact action is transmitted to the intelligent control unit through the online check contact signal sampling unit, the intelligent control unit calculates or queries the corresponding data sheet according to the pressure value P1 of the first pressure sensor, the pressure value P2 and the temperature value T of the second pressure sensor when the contact acts, gets the gas density value, detects the contact signal action value of the gas density relay body, and completes checking the contact signal action value of the gas density relay body; the intelligent control unit drives the pressure regulating mechanism to make the gas pressure drop slowly, so that the gas density relay body has contact reset, the contact reset is transmitted to the intelligent control unit through the online check contact signal sampling unit, the intelligent control unit obtains the gas density value through calculation or query of the corresponding data table according to the pressure value P1 of the first pressure sensor, the pressure value P2 and the temperature value T of the second pressure sensor when the contact resets, detect the contact signal return value of the gas density relay body, and complete checking the contact signal return value of the gas density relay body; when all the contact signal check is completed, the intelligent control unit restores the pressure regulating mechanism to restore the pressure of the gas pressure chamber to atmospheric pressure or the corresponding specified pressure, and adjusts the online check contact signal sampling unit to the working state, the control circuit of the contact signal of the gas density relay body returns to the normal working state.

19. The check method for gas density relay with online self-check function as claimed in claim 17, characterized in that: the gas density relay also includes a temperature regulating mechanism; The check method comprises:

under normal working condition, the gas density relay monitors the gas density value in the electrical equipment, and the gas density relay monitors the gas density value in the electrical equipment online through the first pressure sensor, temperature sensor and intelligent control unit;

the gas density relay is allowed to check the gas density relay body according to at least one of: the set check time or check command and the gas density value;

the online check contact signal sampling unit is adjusted to the check state through the intelligent control unit, in the check state, the online check contact signal sampling unit cuts off the control circuit of the contact signal of the gas density relay, and connects the contact of the gas density relay body to the intelligent control unit;

the pressure regulating mechanism is driven by the intelligent control unit to make the gas pressure in the gas pressure chamber rise slowly, and the temperature regulating mechanism is controlled by the intelligent control unit to make the temperature of the temperature compensation element of the gas density relay body rise, so that the gas density relay body has contact action, and the contact action is transmitted to the intelligent control unit through the online check contact signal sampling unit, according to the pressure value P1 of the first pressure sensor, the pressure value P2 of the second pressure sensor and the temperature value T when the contact acts, the intelligent control unit obtains the gas density value by calculating or querying the corresponding data table, detects the contact signal action value of the gas density relay body to complete checking the contact signal action value of the gas density relay body;

the intelligent control unit drives the pressure regulating mechanism to make the gas pressure drop slowly, and the intelligent control unit controls the temperature regulating mechanism to make the temperature of the temperature compensation element of the gas density relay body drop, so that the gas density relay body has a contact reset, which is transmitted to the intelligent control unit through the online check contact signal sampling unit, according to the pressure value P1 of the first pressure sensor, the pressure value P2 of the second pressure sensor and the temperature value T when the contact is reset, the intelligent control unit obtains the gas density value by calculating or querying the corresponding data table, detects the contact signal return value of the gas density relay body to complete checking the contact signal return value of the gas density relay body; when all the contact signal check work is completed, the intelligent control unit restores the pressure regulating mechanism to restore the pressure of the gas pressure chamber to atmospheric pressure or the corresponding specified pressure, and the intelligent control unit turns off the heating element of the temperature regulating mechanism, and adjusts the online check contact signal sampling unit to the working state, and the control circuit of the contact signal of the gas density relay body returns to the normal working state.

20. The check method for gas density relay with online self-check function as claimed in claim 17, characterized in that: in normal working state, the gas density relay monitors the gas density value in electrical equipment; the gas density relay is allowed to check the gas density relay body according to at least one of: the set check time or check command and the gas density value;

the pressure regulating mechanism is driven by the intelligent control unit to make the gas pressure in the gas pressure chamber rise slowly, making the gas density relay body contact action.

* * * * *